United States Patent [19]
Nozaki et al.

[11] Patent Number: 4,829,273
[45] Date of Patent: May 9, 1989

[54] SURFACE ACOUSTIC WAVE FILTER

[75] Inventors: Masao Nozaki, Yokohama; Yoshihiro Yasuhara, Hiratsuka, both of Japan

[73] Assignee: Kabushiki Kaisha Toshiba, Kanagawa, Japan

[21] Appl. No.: 154,274

[22] Filed: Feb. 10, 1988

[30] Foreign Application Priority Data

Feb. 13, 1987 [JP] Japan .................................. 62-29688
May 14, 1987 [JP] Japan .................................. 62-115805
Nov. 17, 1987 [JP] Japan .................................. 62-288376

[51] Int. Cl.$^4$ ........................ G03H 9/64; G03H 9/145
[52] U.S. Cl. ............................ 333/194; 333/195; 333/196
[58] Field of Search ...................... 333/150–155, 333/193–196; 310/313 R, 313 A, 313 B, 313 C, 313 D

[56] References Cited

U.S. PATENT DOCUMENTS 3,968,461  7/1976  Mitchell et al. .................... 333/196
4,075,582  2/1978  Walker ................................ 333/196

OTHER PUBLICATIONS

IEEE Ultrasonic Symposium Proceeding, "Applications of Double Electrodes in Acoustic Surface Wave Device Design," T. W. Bristol et al., 1972, pp. 343–345.

Primary Examiner—Marvin L. Nussbaum
Attorney, Agent, or Firm—Finnegan, Henderson, Farabow, Garrett, & Dunner

[57] ABSTRACT

A frequency characteristic of a surface acoustic wave filter having at least a first transducer and a second transducer is determined by a product of a frequency amplitude characteristic of the first transducer and that of the second transducer so that the electrodes of the both transducers are formed in such a way that third harmonics band in the frequency characteristic of the first transducer is shifted out that of the second transducer in order to prevent third harmonics.

26 Claims, 14 Drawing Sheets

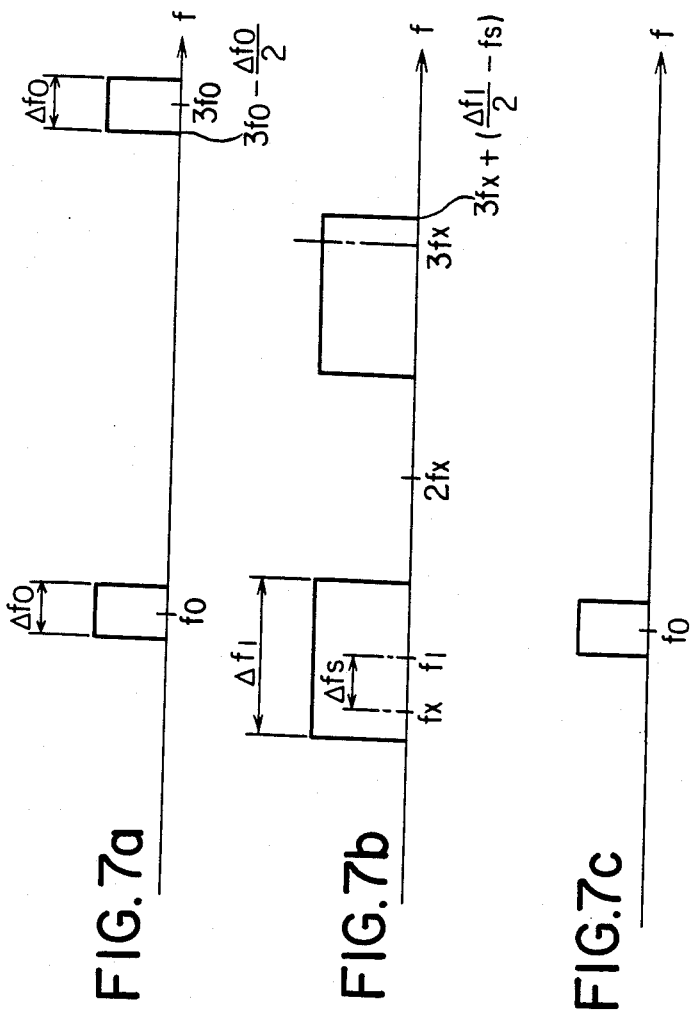

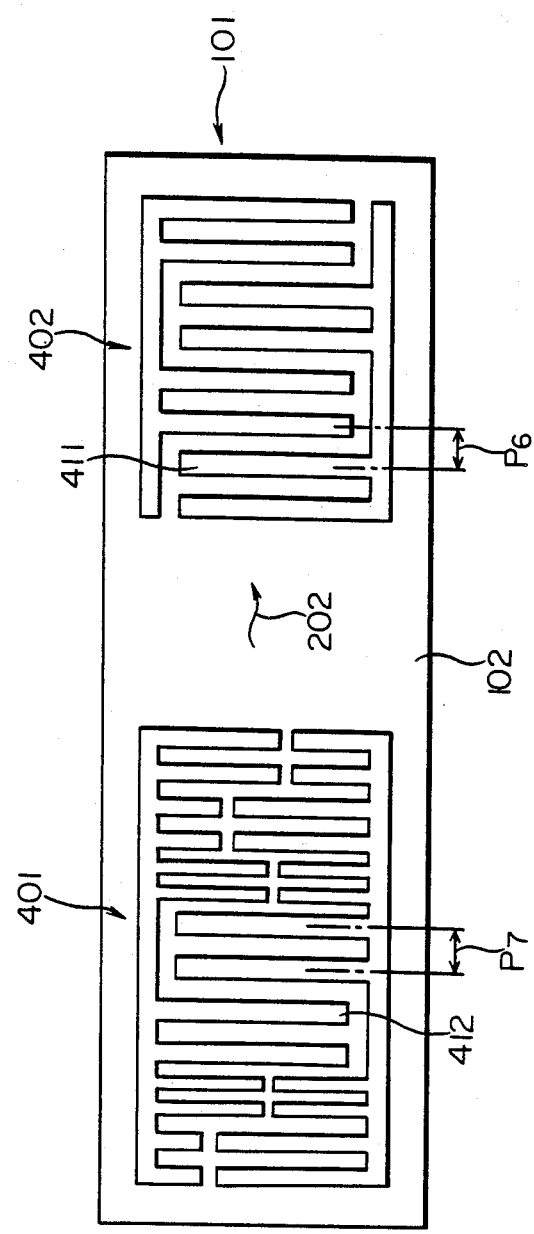

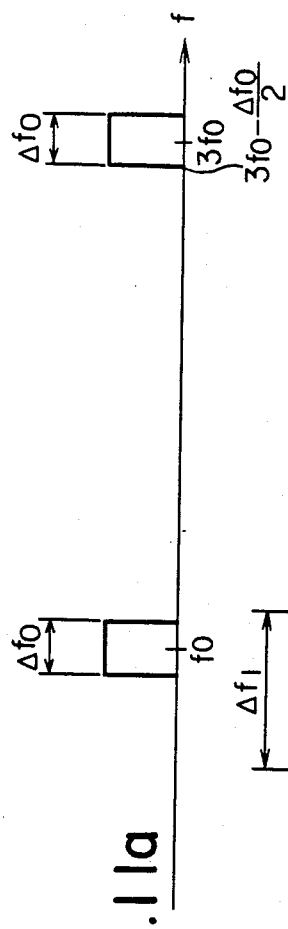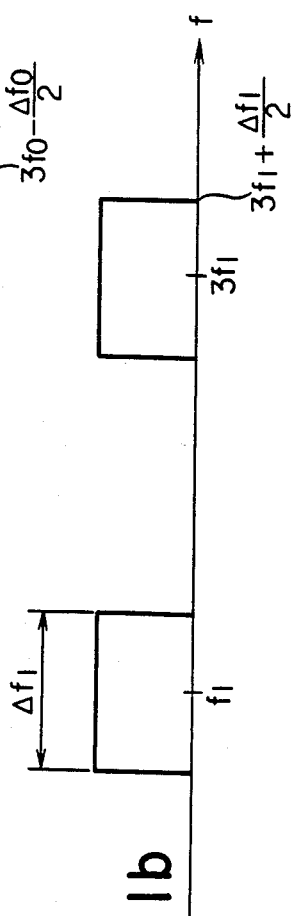

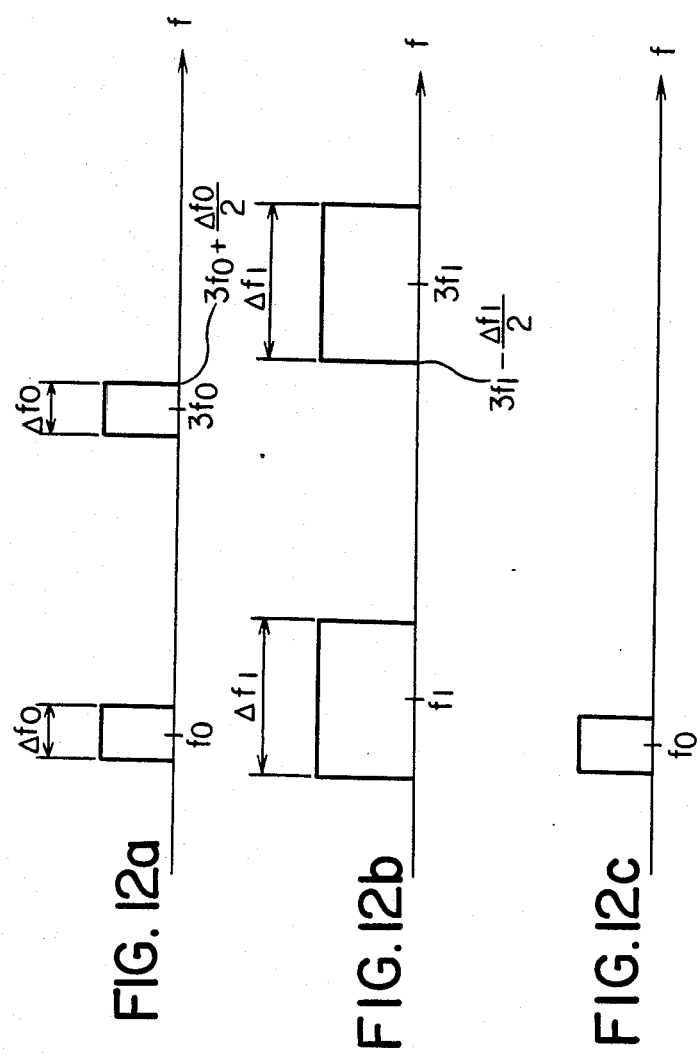

SURFACE ACOUSTIC WAVE FILTER

The present application claims priority of Japanese patent application Nos. 62-029688, filed on Feb. 13, 1987, No. 62-115805, filed on May 14, 1987, and No. 62-288376, filed on Nov. 17, 1987.

FIELD OF THE INVENTION AND RELATED ART STATEMENT

This invention relates to a surface acoustic wave filter (SAW filter), for example, as a delay-line or a filter and, more particularly, to a SAW filter which has an electrode structure for preventing third harmonics.

During the past few years there has been an increasing use of SAW filters for the Picture Intermediate Frequency (PIF) circuit of TV receivers, and the demand for the filter will continue to increase.

A basic structure of the SAW filter is constructed with a first transducer of an input electrode and a second transducer of an output electrode facing toward the first transducer on a piezoelectric substrate comprising lithium tantalate ($LiTaO_3$), lithium niobate oxide ($LiNbO_3$), quartz, and so on.

Each of these transducers comprises a comb-shaped electrode of a plurality of electrode fingers and a comb-shaped electrode of a plurality of electrode fingers crossing each other.

Generally, a desired frequency characteristic can be realized by differing the length of electrode fingers of the electrodes forming at least one of the first transducer and the second transducer.

The transducer with a different length of the electrode fingers is generally called an Apodized electrode (the weighted type electrode) and the other transducer with a constant length of the electrode fingers is called an unweighted electrode.

A center frequency $f_0$ in a passband of a frequency amplitude characteristic of the SAW filter which is constructed with the Apodized electrode and the unweighted electrode, will be determined as follows. In other words, the unweighted electrode has an electrode pitch (the distance between the approximate centers of the adjacent electrode fingers) which is defined by the center frequency $f_0$. On the other hand, the Apodized electrode has an electrode pitch which is defined by a frequency in the vicinity to the center frequency $f_0$. When both of the first and second transducers are constructed with the Apodized electrode, it is typical to arrange between the transducers a multi-strip coupler with a plurality of electrode fingers having a constant space in between.

The frequency characteristic of the conventional SAW filter using the above multi-strip coupler will be explained with reference to FIG. 15(a) and a frequency characteristic of the second transducer is shown in FIG. 15(b).

As understood from the drawings in FIG. 15(a) and (b), frequencies $f_0$ and $3f_0$ are to be a passband (a frequency passband) of both the first and second transducers. The frequency characteristic of the SAW filter is expressed by the product of the frequency characteristic of the first transducer and that of the second transducer so that the frequency characteristic of the SAW filter is shown in FIG. 15(c).

It is clear from the FIG. 15(c) that the frequency characteristic of the SAW filter has passbands not only in the vicinity to $f_0$ but also in the vicinity to $3f_0$ in which so-called third harmonics appears. This third harmonic causes characteristic degradation of the SAW filter, and is considered to be very important for TV receivers and so on.

In order to prevent the third harmonics, it is known to construct one of the transducers with a solid electrode. The solid electrode in this case means an unweighted electrode in which the width of the electrode and the space between the electrodes are equal in size to each other.

For manufacturing the above structure of the SAW filter, the electrode should be formed in such a way that the width of the electrode is completely equal in size to the space between the electrodes, which has the drawback of requiring a very accurate manufacturing technique, decreasing its production yield and increasing its manufacturing cost.

OBJECT AND SUMMARY OF THE INVENTION

Therefore, an object of the invention is to provide an improved surface acoustic wave filter which reduces third harmonics and has an improved frequency characteristic.

Another object of the invention is to reduce the accuracy requirements of the electrode manufacturing process for the filter, and to provide a filter which can be made easily and which has no third harmonics.

Still another object of the invention is to provide a filter having no third harmonics and at low cost.

To achieve the objects of the invention, a surface acoustic wave filter according to the invention is constructed with a piezoelectric substrate, a first transducer including comb-shaped electrodes with a plurality of electrode fingers crossing each other formed on one major surface of the piezoelectric substrate, a second transducer including comb-shaped electrodes with a plurality of electrode fingers crossing each other formed on the one major surface of the piezoelectric substrate and faced to the first transducer. and a frequency amplitude characteristic of the filter having a frequency passband in the vicinity of the frequency amplitude characteristic of a frequency $f_0$. An electrode pitch of the first transducer and that of the second transducer complies with:

$$f_1 - f_2 \geq \tfrac{1}{2}(\Delta f_1 + \Delta f_2) \text{ for } f_1 \geq f_2$$

$$f_2 - f_1 \geq \tfrac{1}{2}(\Delta f_1 + \Delta f_2) \text{ for } f_1 < f_2$$

(wherein, $\Delta f_1$ is the frequency passband width of the first transducer, $\Delta f_2$ is the frequency passband width of the second transducer, $f_1$ is the frequency of the first transducer defining the electrode pitch of the first transducer, and $f_2$ is the frequency of the second transducer defining the electrode pitch of the second transducer.

Further, the surface acoustic wave filter of the present invention may be constructed with a piezoelectric substrate, a first transducer including comb-shaped electrodes with a plurality of electrode fingers crossing each other formed on one major surface of the piezoelectric substrate, a second transducer including comb-shaped electrodes with a plurality of electrode fingers crossing each other formed on the one major surface of the piezoelectric substrate and faces to the first transducer, and a frequency passband width is $\Delta f_0$ and a center frequency $f_0$ of the frequency passband width is $\Delta f_0$, wherein a frequency passband width of the first transducer is $\Delta f_0$, a center frequency of the frequency passband width $\Delta f_0$ is $f_0$, a frequency passband width of the second transducer is $\Delta f_1$. The frequency passband has a frequency in a vicinity to the center frequency $f_1$ of the frequency passband width $\Delta f_1$, the electrode pitch of the adjacent electrode fingers comprising the second transducer is defined by frequency $f_x$ and the following formula is satisfied:

$$4f_x - f_1 \geq 3f_0 + \Delta f_0/2 + \Delta f_1/2$$

or $$4f_x - f_1 \leq 3f_0 - \Delta f_0/2 - \Delta f_1/2$$

Further, the surface acoustic wave filter of the present invention may be constructed with a piezoelectric substrate, a first transducer includes comb-shaped electrodes with a plurality of electrode fingers crossing each other formed on one major surface of the piezoelectric substrate, a second transducer includes comb-shaped electrodes with a plurality of electrode fingers crossing each other fomed on the one major suface of the piezoelectric substrate and faces to the first transducer, a frequency passband width $\Delta f_0$ and a center frequency $f_0$ of the frequency passband width $\Delta f_0$, wherein a frequency passband width of the first transducer is $\Delta f_0$, a frequency passband width of the second transducer is $\Delta f_1$, a center frequency of the frequency passband width $\Delta f_1$ is $f_1$, complied with:

$$f_1 \leq f_0 - \Delta f_0/6 - \Delta f_1/6$$

or $$f_1 \geq f_0 + \Delta f_0/6 - \Delta f_1/6.$$

BRIEF DESCRIPTION OF THE DRAWINGS

FIG. 7(a) through FIG. 7(c) are the frequency characteristic diagrams for explaining the operation of the embodiment shown in FIG. 6;

FIG. 9 is a type plan for explaining another embodiment of the SAW filter according to the present invention;

FIG. 11(a) through FIG. 11(c) are the frequency characteristic diagrams for explaining the operation of the embodiment shown in FIG. 10;

FIG. 12(a) through FIG. 12(c) are the frequency characteristic diagrams for explaining the operation of the embodiment shown in FIG. 10;

DETAILED DESCRIPTION OF PREFERRED EMBODIMENTS

Figure 1:
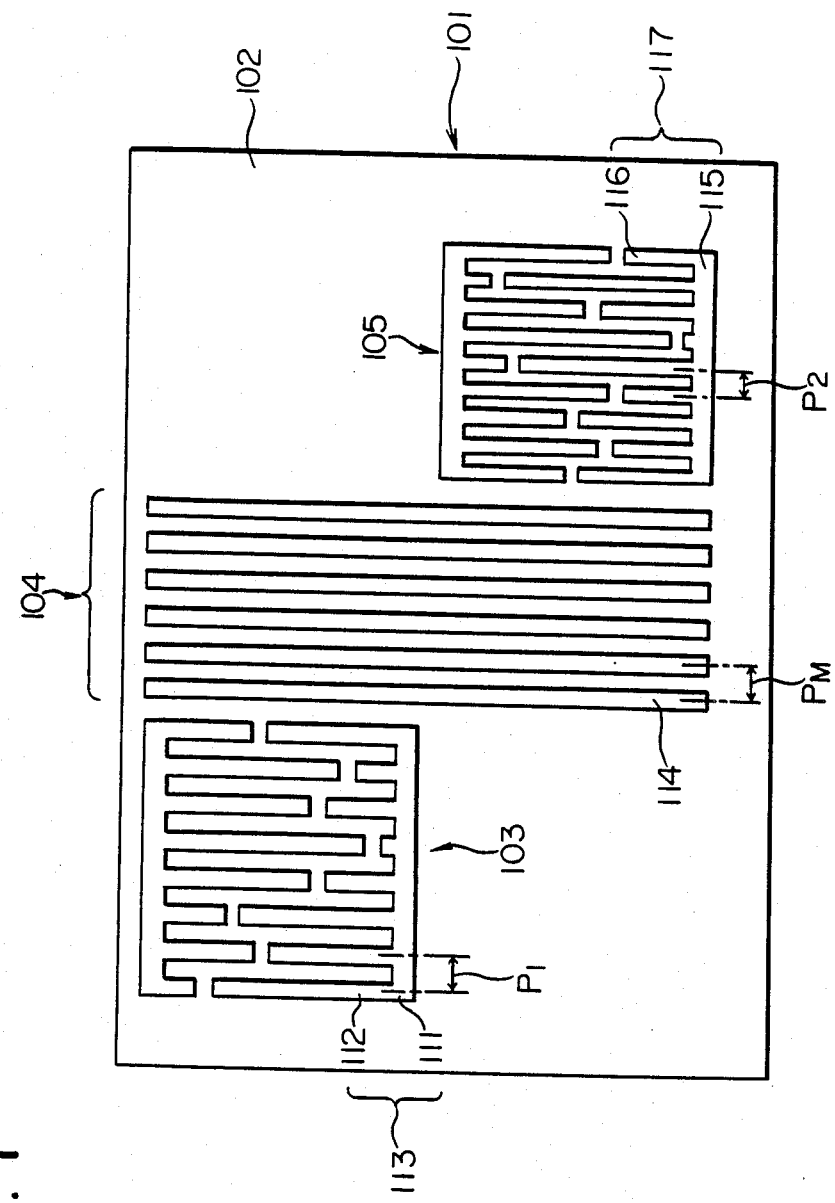
FIG. 1 is a type plan for explaining an embodiment of the SAW filter according to the present invention.

Referring to the drawings, embodiments of the SAW filter according to the present invention will now be explained.

FIG. 1 shows the electrode construction of an embodiment of the SAW filter. As shown in FIG. 1, a surface acoustic wave filter 101 comprises a first transducer 103 formed on a piezoelectric substrate 102 of lithium tantalate oxide ($LiTaO_3$), lithium niobate oxide ($LiNbO_3$), lithium tetraborate ($Li_2B_4O_7$) quartz and so on, a multi-strip coupler 104 by which a surface acoustic wave transmitted from the first transducer 103 is propagated, and a second transducer 105 formed symmetrically with respect to the first transducer 103 for receiving the surface acoustic wave.

A frequency amplitude characteristic of the SAW filter 101 has a frequency passband in the vicinity of a frequency $f_0$.

The first transducer 103 comprises an electrode of aluminum in which one end of a plurality of adjacent electrode fingers 112 is electrically coupled to a bus bar 111 to construct a comb-shaped electrode 113, with the electrode fingers 112 being crossed in that they have non-uniform lengths. This structure of the electrode fingers 112 is so called "weighted" so that the first transducer 103 is formed an Apodized electrode.

The first transducer 103 is an Apodized electrode which has a frequency passband width of $\Delta f_1$, a frequency passband in the vicinity of the frequency $f_0$, and an electrode pitch $P_1$ of ¼ wavelength $\lambda$ of a surface acoustic wave corresponding to a frequency $f_1$.

The multi-strip coupler 104 comprises an electrode of aluminum in which each of a plurality of electrode fingers 114 is arranged with a constant electrode pitch $P_M$ defined by the frequency $f_0$.

The second transducer 105 comprises an electrode of aluminum in which one end of a plurality of adjacent fingers 116 is electrically coupled to a bus bar 115 to construct a comb-shaped electrode 117, with the electrode fingers 116 being crossed in that they have non-uniform lengths. This structure of the electrode fingers 116 is so called "weighted" so that the second transducer 105 is formmed as an Apodized electrode.

The second transducer 105 is an Apodized electrode which has a frequency passband width of $\Delta f_2$, a frequency passband in the vicinity of the frequency $f_0$, and an electric pitch $P_2$ of ¼ wavelength $\lambda$ of a surface acoustic wave corresponding to a frequency $f_2$.

The frequencies $f_1$ and $f_2$ which define the electrode pitch of the first transducer 103 and that of the second transducer 105, respectively, will now be explained.

First, a case in whih the frequencies $f_1$ and $f_2$ will be addressed have the relation of $f_1 > f_2$.

Figure 2:
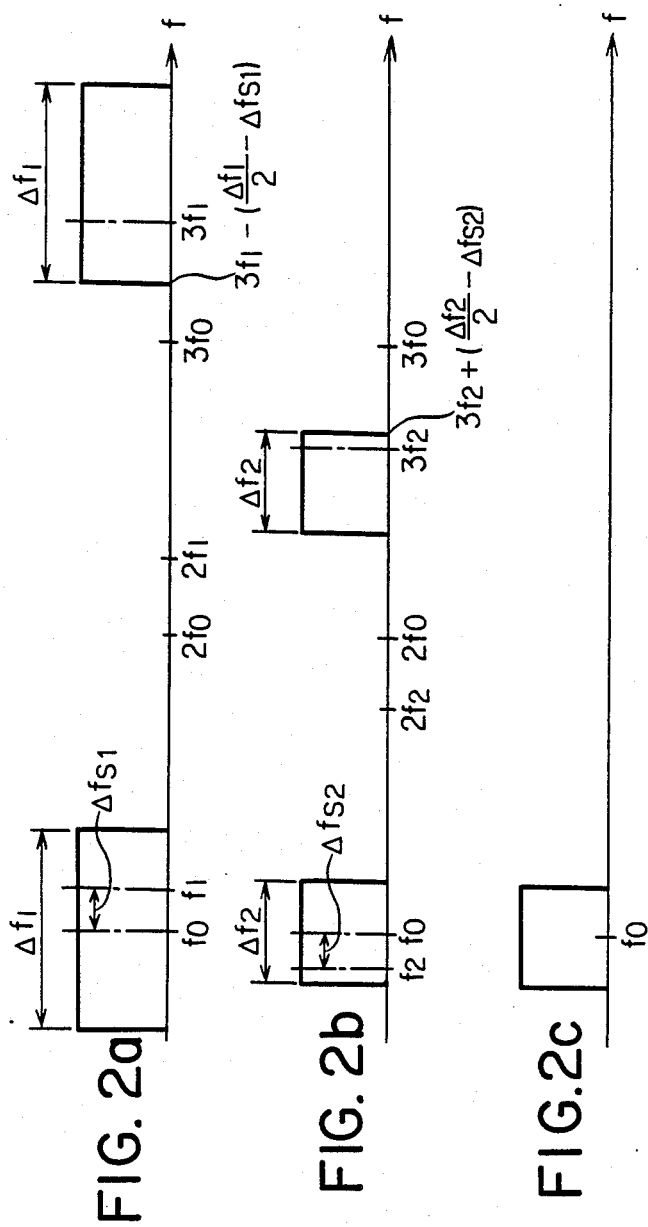
FIG. 2(a) through FIG. 2(c) are the frequency characteristic diagrams for explaining the operation of the embodiment shown in FIG. 1.

FIG. 2(a) shows the frequency characteristic of the first transducer 103, and FIG. 2(b) shows the frequency characteristic of the second transducer 105.

In the case of a SAW filter as shown in FIG. 1, in order to prevent the production of third harmonics, a frequency passband in the vicinity of the frequency $3f_0$ of the first transducer 103 should not overlap with a frequency passband in the vicinity of the frequency $3f_0$ of the second transducer 105 (defined as "condition ($A_1$)").

As to FIG. 2(a) regarding the first transducer 103, the passband in the vicinity of the frequency amplitude characteristics of $f_0$ and that of $3f_0$ are symmetrical to each other about the frequency $2f_1$ as the center of the symmetry. Therefore, $$\Delta f_{s1} = f_1 - f_0 \qquad (1)$$

is taken, third harmonics of the first transducer 103 commence with:

$$3f_1 - (\Delta f/2 - \Delta f_{s1}) \qquad (2)$$

In the same way, as to FIG. 2(b) regarding the second transducer 105, the passbands in the vicinity of the frequency amplitude characteristic of $f_0$ and that of $3f_0$ are symmetrical to each other about the frequency $2f_2$. Therefore, $$\Delta f_{s2} = f_0 - f_2 \qquad (3)$$

is obtained, third harmonics of the second transducer 105 end with:

$$3f_2 + (\Delta f_2/2 - \Delta f_{s2}) \qquad (4)$$

Now, in order to satisfy the above condition ($A_1$), the formula (4) should be less than or equal to the formula (2) so that the formula is:

$$3f_2 + (\Delta f_2/2 - \Delta f_{s2})$$
$$\leq 3f_1 - (\Delta f_1/2 - \Delta f_{s1})$$

The formulas (1), (2) are substituted into the above formula to obtain:

$$3f_2 + (\Delta f_2/2 - f_0 + f_2) \leq 3f_1 - (\Delta f_1/2 - f_1 + f_0) \therefore f_1 - f_2$$
$$\geq \tfrac{1}{8}(\Delta f_1 + \Delta f_2) \qquad (5)$$

Next, a case in which the frequencies $f_1$, $f_2$ have the relation of $f_2 < f_1$ will be explained with reference to FIG. 3. In FIG. 3(a), $$\Delta f_{s1} = f_0 - f_1 \qquad (6)$$

is obtained, third harmonics of the first transducer 103 end with:

$$3f_1 + (\Delta f_1/2 - \Delta f_{s1}) \qquad (7)$$

In FIG. 3(b), $$\Delta f_{s2} = f_2 - f_0 \qquad (8)$$

is taken, third harmonics of the second transducer 105 commence with:

$$3f_2 - (\Delta f_2/2 - \Delta f_{s2}) \qquad (9)$$

Now, in order to satisfy the condition ($A_1$), the formula (7) should be less than or equal to the formula (9) so that the formula is:

$$3f_1 + (\Delta f_1/2 - \Delta f_{s1}) \leq 3f_2 - (\Delta f_2/2 - \Delta f_{s2})$$

The formulas (6), (8) are substituted into the above formula to obtain:

$$3f_1 + (\Delta f_1/2 - f_0 + f_1) \leq 3f_2 - (\Delta f_2/2 - f_2 + f_0) \therefore f_2 - f_1$$
$$\geq \tfrac{1}{8}(\Delta f_1 + \Delta f_2) \qquad (10)$$

Now, the formulas (5) and (10) are combined so that:

$$f_1 - f_2 \geq \tfrac{1}{8}(\Delta f_1 + \Delta f_2) \text{ for } f_1 \geq f_2$$

$$f_2 - f_1 \geq \tfrac{1}{8}(\Delta f_1 + \Delta f_2) \text{ for } f_1 < f_2$$

are obtained.

In other words, when the electrode pitches of the first and second transducers are determined respectively by the frequencies $f_1$ and $f_2$ to satisfy the formula (11), an extremly good characteristic as shown in FIG. 2(c) and FIG. 3(c) can be obtained without having the production of third harmonics in the frequency characteristic of the SAW filter 101 shown in FIG. 1.

Although the multi-strip coupler is used in the above mentioned embodiment, the invention is not restricted to this embodiment and can also be a SAW filter without the multistrip coupler.

Another embodiment of SAW filter without multi-strip coupler according to the present invention will now be explained. In the following, like reference numerals are used for like or corresponding parts in FIG. 1.

Figure 4:
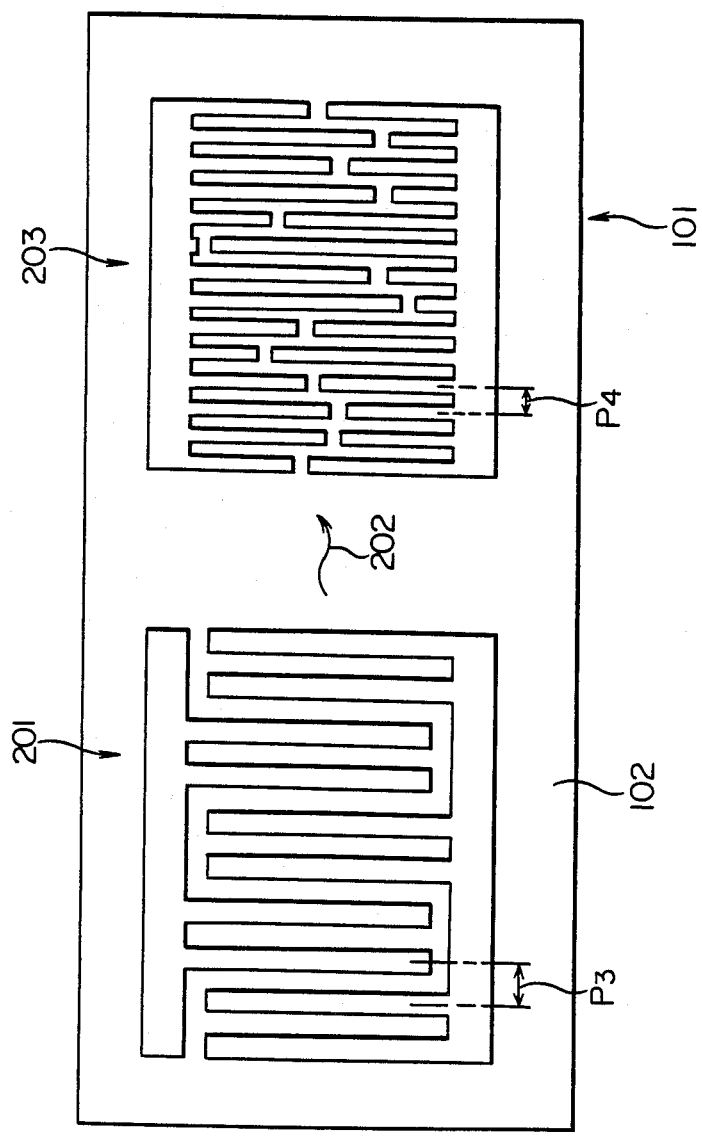
FIG. 4 is a type plan for explaining another embodiment of the SAW filter according to the present invention.

When the multi-strip coupler is not used, one of the transducers comprises the weighted type electrode and the other comprises the unweighted electrode. FIG. 4 illustrates the electrode structure of the SAW filter without the multi-strip coupler.

In FIG. 4, a surface acoustic wave filter 101 comprises a first transducer 201 formed on a piezoelectric substrate 102, a second ransducer 203 for receiving a surface acoustic wave 202 transmitted by the first transducer 201 formed on a piezoelectric substrate 102 to face the first transducer 201. The frequency amplitude characteristic of the device has a fundamental or center frequency $f_0$.

The first transducer 201 is a so-called unweighted electrode with a constant cross width in which the adjacent two electrode fingers are in pairs to comprise a double electrode.

The first transducer 201 has a center frequency of $f_0$, a frequency passband width of $\Delta f_1$, and an electrode pitch $P_3$ of $\tfrac{1}{4}$ wave length $\lambda$ of a surface acoustic wave corresponding to the center frequency $f_0$.

The second transducer 203 is an Apodized electrode which has a frequency passband width of $\Delta f_2$, a frequency passband in the vicinity of frequency $f_0$ and an electrode pitch $P_4$ of $\tfrac{1}{4}$ wavelength $\lambda$ of a surface acoustic wave corresponding to a frequency $f_2$.

The frequencies $f_0$ and $f_2$ which define the electrode pitch of the first transducer 201 and that of the second transducer 203 will now be addressed.

First, a case in which the frequencies $f_0$ and $f_2$ have the relation of $f_0 > f_2$ will be addressed.

FIG. 5(a) shows a frequency characteristic of the first transducer 201 and FIG. 5(b) shows a frequency characteristic of the second transducer 203.

Figure 5:
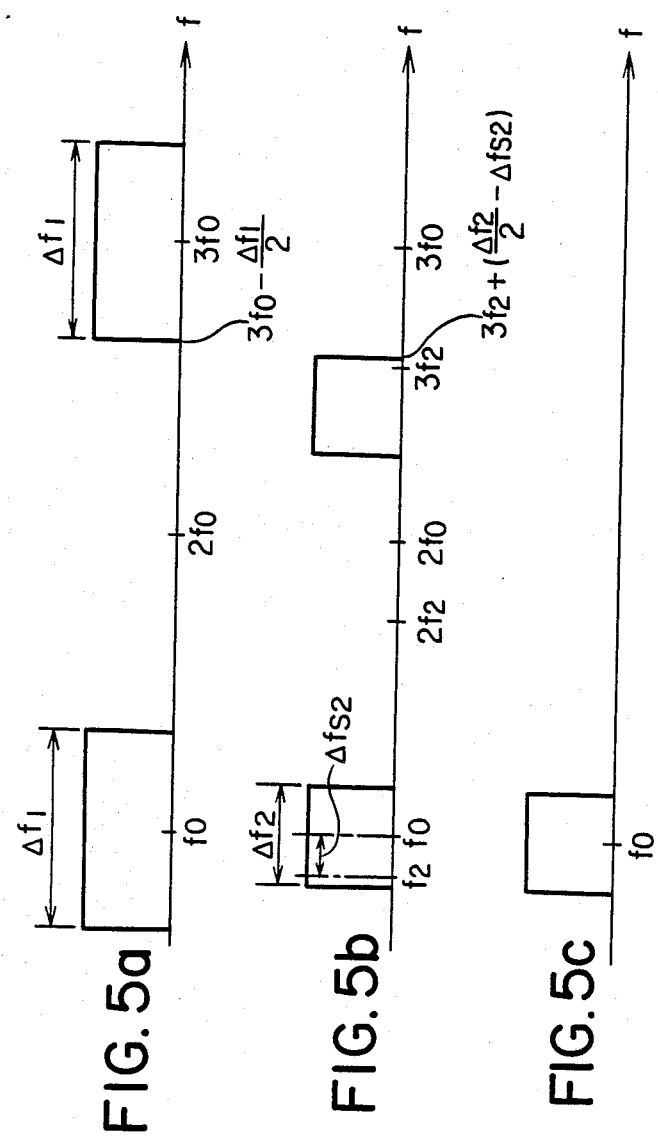
FIG. 5(a) through FIG. 5(c) are the frequency characteristic diagrams for explaining the operation of the embodiment shown in FIG. 4.

In order to satisfy the condition $A_1$, the following formula is obtained from FIG. 5:

$$3f_0 - \Delta f_1/2 \geq 3f_2 + (\Delta f_2/2 - \Delta f_{s2}) \quad (21)$$

wherein, $$\Delta f_{s2} = f_0 - f_2 \quad (22)$$

Formula (22) is substituted for formula (21) to obtain:

$$3f_0 - \Delta f_1/2 \geq 3f_2 + (\Delta f_2/2 - f_0 + f_2) \therefore f_0 - f_2 \geq \tfrac{1}{4}(\Delta f_1 + \Delta f_2) \quad (23)$$

Then, the same approach is applied for the relation of $f_0 < f_2$ so that:

$$f_2 - f_0 \geq \tfrac{1}{4}(\Delta f_1 + \Delta f_2) \quad (24)$$

and the formulas (23) and (24) are combined so that:

$$|f_0 - f_2| \geq \tfrac{1}{4}(\Delta f_1 + \Delta f_2) \quad (25)$$

are obtained.

Figure 3:
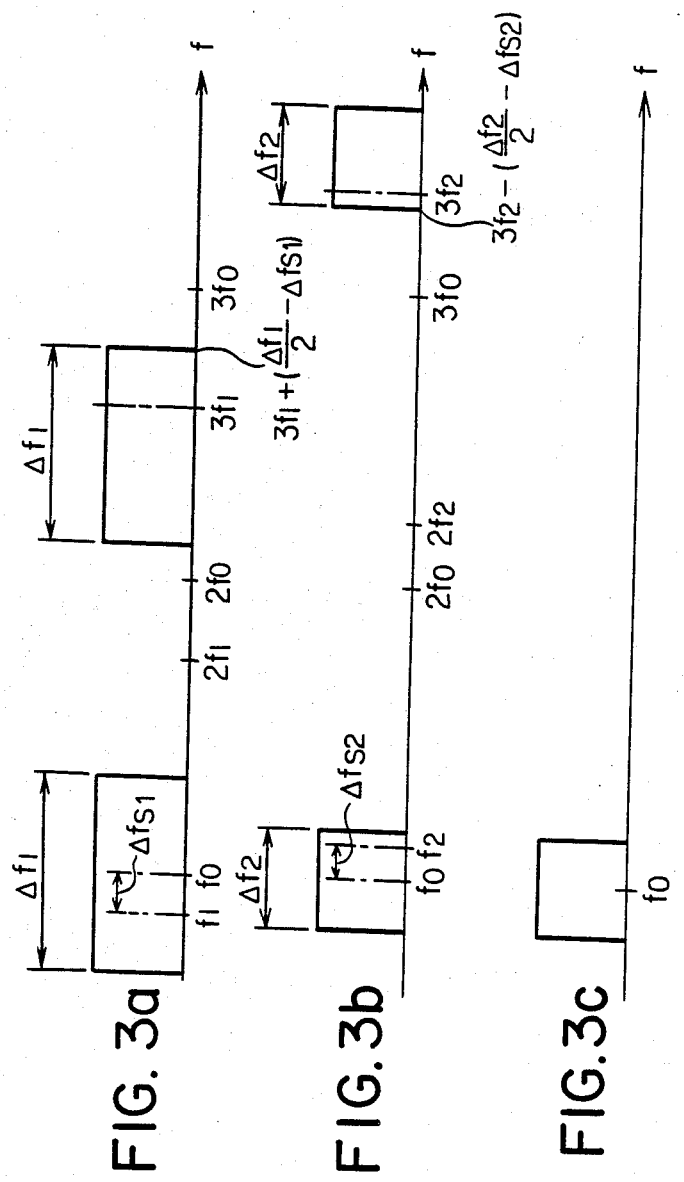
FIG. 3(a) through FIG. 3(c) are the frequency characteristic diagrams for explaining the operation of the embodiment shown in FIG. 1.

When $f_0$ in FIG. 5 is considered to correspond to $f_1$ in FIG. 3, $f_0 = f_1$ is substituted for the formula (25) which results in the same as the formula (11).

Another embodiment according to the invention will now be described with reference to FIG. 6 to FIG. 9. In the following description, like reference characters are used for like or corresponding parts in FIG. 1.

Figure 6:
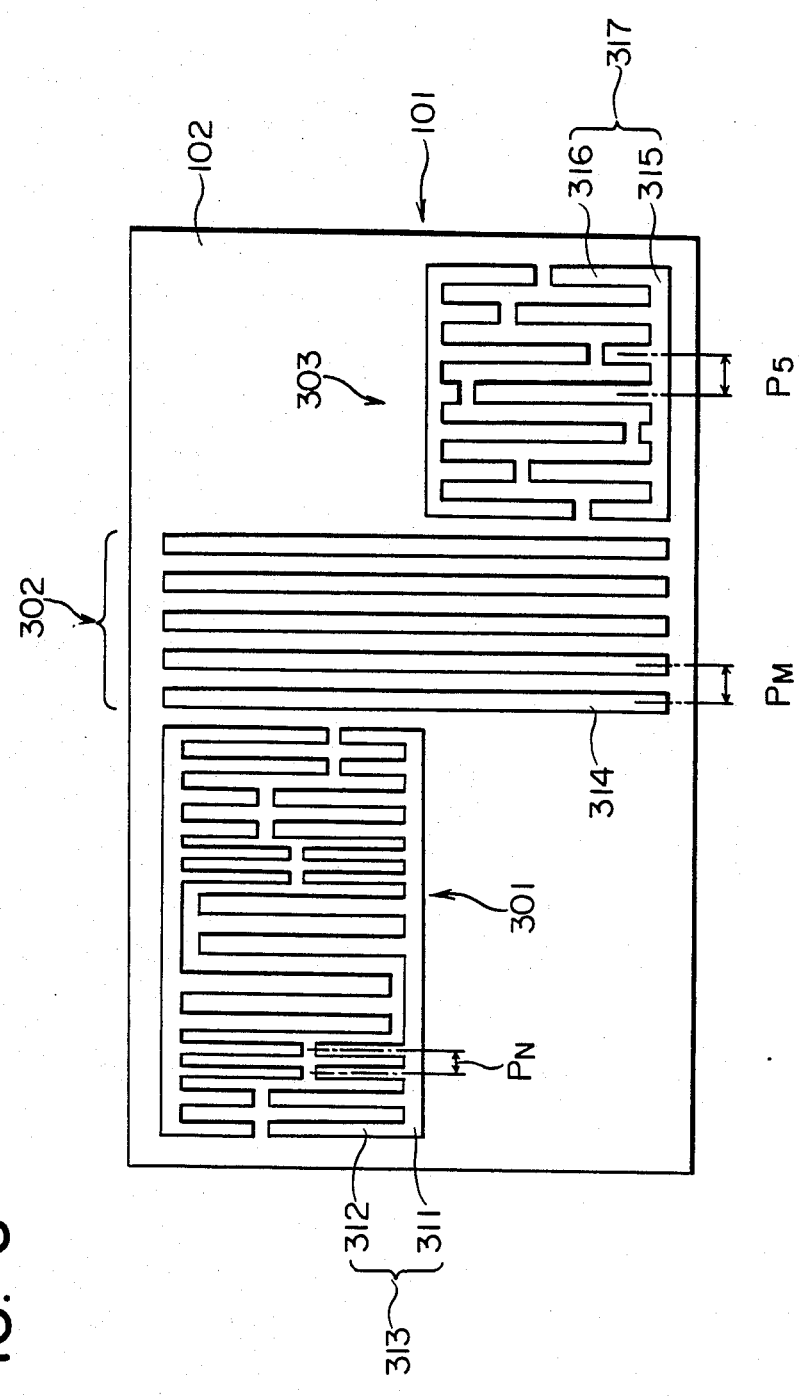
FIG. 6 is a type plan for explaining another embodiment of the SAW filter according to the present invention.

In FIG. 6, a surface acoustic wave filter 101 comprises a first transducer 301 formed on a piezoelectric substrate 102, a multi-strip coupler 302 by which a surface acoustic wave transmitted by the first transducer 301 is propogated, a second transducer 303 for receiving the surface acoustic wave formed approximately in the position of point symmetry relative to the first transducer 301.

A frequency amplitude characteristics of the SAW filter 101 has a center frequency $f_0$ of a passband and a frequency passband width of $\Delta f_0$.

The first transducer 301 comprises an electrode of aluminum in which one end of a plurality of electrode fingers 312 crossing each other is electrically coupled by a bus bar 311 to construct a comb-shaped electrode 313.

The crossing structure of the electrode fingers 312 is so called "weighted" so that the first transducer 301 is formed as an Apodized electrode.

The first transducer 301 is an Apodized electrode which has a frequency passband width of $\Delta f_0$, a center frequency $f_0$ of the frequency passband width $\Delta f_0$, and an electrode pitch $P_N$ of $\tfrac{1}{4}$ wavelength $\lambda$ of the surface acoustic wave corresponding to the frequency $f_0$.

The multi-strip coupler 302 comprises an electrode of aluminum in which each of a plurality of electrode fingers 314 is arranged with a constant electrode pitch $P_M$ defined by the frequency $f_0$.

The second transducer 303 comprises an electrode of aluminum in which one end of a plurality of electrode fingers 316 crossing each other is electrically short-circuited by a bus bar 315 to construct a comb-shaped electrode 317. The crossing structure of the electrode fingers 316 is so called "weighted" so that the second transducer 303 is formed as an Apodized electrode.

The second transducer 303 is an Apodized electrode which has a frequency passband width of $\Delta f_1$, a frequency passband in the vicinity of the frequency amplitude characteristics of a frequency $f_1$, and an electrode pitch $P_5$ of $\tfrac{1}{4}$ wavelength $\lambda$ of the surface acoustic wave corresponding to a frequency $f_x$.

A relation of the center frequency $f_0$ and the frequency passband width $\Delta f_0$ of the first transducer 301, the center frequency $f_1$ and the frequency passband width $\Delta f_1$ of the second transducer 303, and the frequency $f_x$ defining the electrode pitch will now be explained.

A case in which the frequencies $f_1$ and $f_x$ will first be addressed have the relation of $f_1 > f_x$.

FIG. 7(a) shows a frequency characteristic of the first transducer 301 and FIG. 7(b) shows a frequency characteristic of the second transducer 303.

For the SAW filter as shown in FIG. 6, in order to prevent production of third hamonics, a frequency passband in the vicinity of the frequency $3f_0$ of the first transducer 301 should not overlap with a frequency passband in the vicinity of the frequency $3f_1$ of the second transducer 303 (defined as "condition $(A_2)$").

As to FIG. 7(a) of the first transducer 301, a passband in the vicinity of a frequency $3f_0$ has a center frequency $3f_0$ and a frequency passband width $\Delta f_0$ so that the frequency passband commences with:

$$3f_0 - \Delta f_0/2 \quad (31)$$

As to FIG. 7(b) of the second transducer 303, a passband in the vicinity of a frequency amplitude characteristic of $f_1$ and that of $3f_1$ are symmetrical to each other about the frequency $2f_x$ as the center of the symmetry. Therefore, the relation:

$$\Delta f_s = f_1 - f_x \quad (32)$$

is obtained, third harmonics of the second transducer 303 end with:

$$3f_x + (\Delta f_1/2 - \Delta f_s) \quad (33)$$

Now, in order to satisfy the above condition $(A_2)$, the formula (33) should be less than or equal to the formula (31) so that the formula is:

$$3f_x + (\Delta f_1/2 - \Delta f_s) \leq 3f_0 - \Delta f_0/2$$

The formula (32) is substituted into the above formula:

$$3f_x + (\Delta f_1/2 - f_1 + f_x) \leq 3f_0 - \Delta f_0/2 \therefore 4f_x - f_1 \leq 3f_0 - \Delta f_0/2 - \Delta f_1/2 \quad (34)$$

Next, a case in which the frequency $f_1$ and $f_x$ have the relation of $f_1 < f_x$ will be explained with reference to FIG. 8.

Figure 8A:
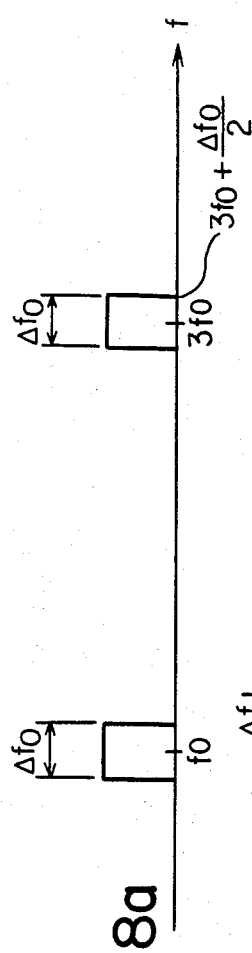
FIG. 8(a) through FIG. 8(c) are the frequency characteristic diagrams for explaining the effect of the embodiment shown in FIG. 6.

As to FIG. 8(a) for the first transducer 301, a passband in the vicinity of the frequency amplitude characteristic $3f_0$ has a center frequency $3f_0$ and a frequency passband width $\Delta f_0$ so that the frequency passband ends with:

$$3f_0 + \Delta f_0/2 \quad (35)$$

Figure 8B:
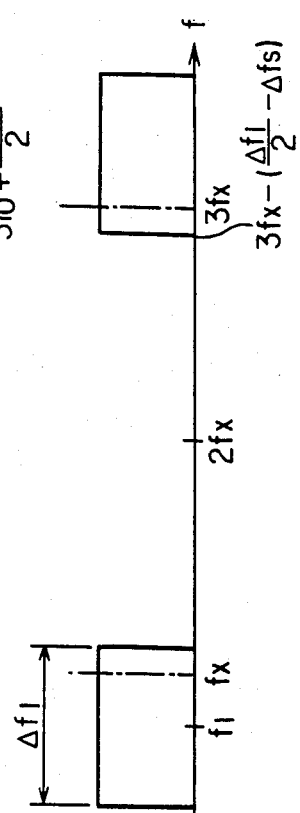

As to FIG. 8(b) for the second transducer 303, a passband in the vicinity of the frequency amplitude characteristic of $f_1$ and that of $3f_1$ are symmetrical to each other about the frequency $2f_x$ as the center of the symmetry.

Therefore, $$\Delta f_s = f_x - f_1 \tag{36}$$

is obtained, and third harmonics of the second transducer 303 commence with:

$$3f_x - (\Delta f_1/2 - \Delta f_s) \tag{37}$$

Now, in order to satisfy the condition ($A_2$), the formula (35) should be less than or equal to the formula (37) so that the formula is:

$$3f_0 + \Delta f_0/2 \leq 3f_x - (\Delta f_1/2 - \Delta f_s) \tag{}$$

The formula (36) is substituted into the above formula to obtain:

$$3f_0 + \Delta f_0/2 \leq 3f_x - (\Delta f_1/2 - f_x + f_1) \therefore 4f_x - f_1 \geq 3f_0 + \Delta f_0/2 + \Delta f_1/2 \tag{38}$$

Figure 8C:
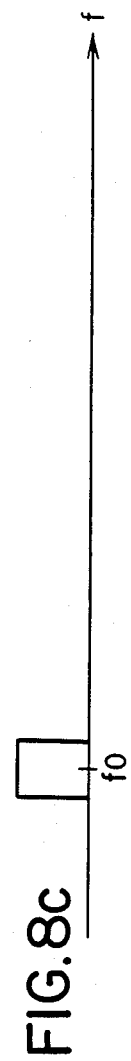

In other words, when the first and second transducers are formed so as to satisfy the formulas (34) and (38), respectively, extremely good characteristics as shown in FIG. 7(c) and FIG. 8(c) can be obtained without producing third harmonics in the frequency characteristic of the SAW filter 101 shown in FIG. 6.

Although a multi-strip coupler is used in the above mentioned embodiments, the invention is not restricted to these embodiments and can also include a SAW filter without the multi-strip coupler.

Another embodiment of the invention comprising a SAW filter without the multi-strip coupler will now be explained with reference to FIG. 9. In the following discussion, the same reference numerals are used for identical parts in FIG. 6.

When the multi-strip coupler is not used, one of the transducers comprises the weighted type electrode and the other comprises the unweighted electrode. FIG. 9 illustrates the electrode structure of the SAW filter.

In FIG. 9, a surface acoustic wave filter 101 comprises a first transducer 401 formed on a piezoelectric substrate 102, a second transducer 402 for receiving a surface acoustic wave 202 exited from the first transducer 401 formed on piezoelectric substrate 102 to face the first transducer 401.

Hereupon, a frequency amplitude characteristic of the SAW filter 101 has a frequency passband in the vicinity of the frequency amplitude characteristic of a frequency $f_0$.

The second transducer 402 is a so-called unweighted electrode with a constant cross width in which the adjacent two electrode fingers are in pairs to be a double electrode.

The second transducer 402 has a center frequency of $f_1$, a frequency passband width of $\Delta f_1$, and an electrode pitch $P_6$ which is formed by the electrode fingers 411 of $\frac{1}{4}$ wavelength $\lambda$ of the surface acoustic wave corresponding to the center frequency $f_1$.

The first transducer 401 comprises an Apodized electrode which has a frequency passband width of $\Delta f_0$, a frequency passband in the vicinity of the frequency $f_0$ and an electrode pitch $P_7$ of $\frac{1}{4}$ wavelength $\lambda$ of the surface acoustic wave corresponding to the frequency $f_0$.

This case coincides with a case when the following formula is applied to FIG. 7 and FIG. 8:

$$f_x = f_1 \tag{41}$$

The frequencies $f_0$ and $f_1$ which define the electrode pitch of the first transducer 401 and that of the second transducer 403 respectively, will now be addressed.

First, a case in which the frequencies $f_0$ and $f_1$ will be explained have the relation of $f_0 > f_1$.

According to FIG. 7, a passband of the frequency characteristic $3f_0$ of the first transducer commences with:

$$3f_0 - \Delta f_0/2 \tag{42}$$

A passband of the frequency characteristic $3f_1$ of the second transducer ends with:

$$3f_1 + \Delta f_1/2 \tag{43}$$

Now, in order to satisfy the condition ($A_2$), the formula (43) should be less than or equal to the formula (42) so that the formula is:

$$3f_1 + \Delta f_1/2 \leq 3f_0 - \Delta f_0/2$$

Then:

$$3f_1 \leq 3f_0 - \Delta f_0/2 - \Delta f_1/2 \tag{44}$$

is obtained.

This results in the same formula as when the formula (35) is substituted into the formula (34).

The same approach can be applied to the relation of $f_0 < f_1$ so that $$3f_1 \geq 3f_0 + \Delta f_0/2 + \Delta f_1/2 \tag{45}$$

is obtained. This results in the same formula as when the formula (41) is substituted into the formula (38).

Another embodiment according to the invention will now be explained with reference to FIGS. 10 to 13. In the following discussion, the same reference characters are used for identical parts in FIG. 6.

Figure 10:
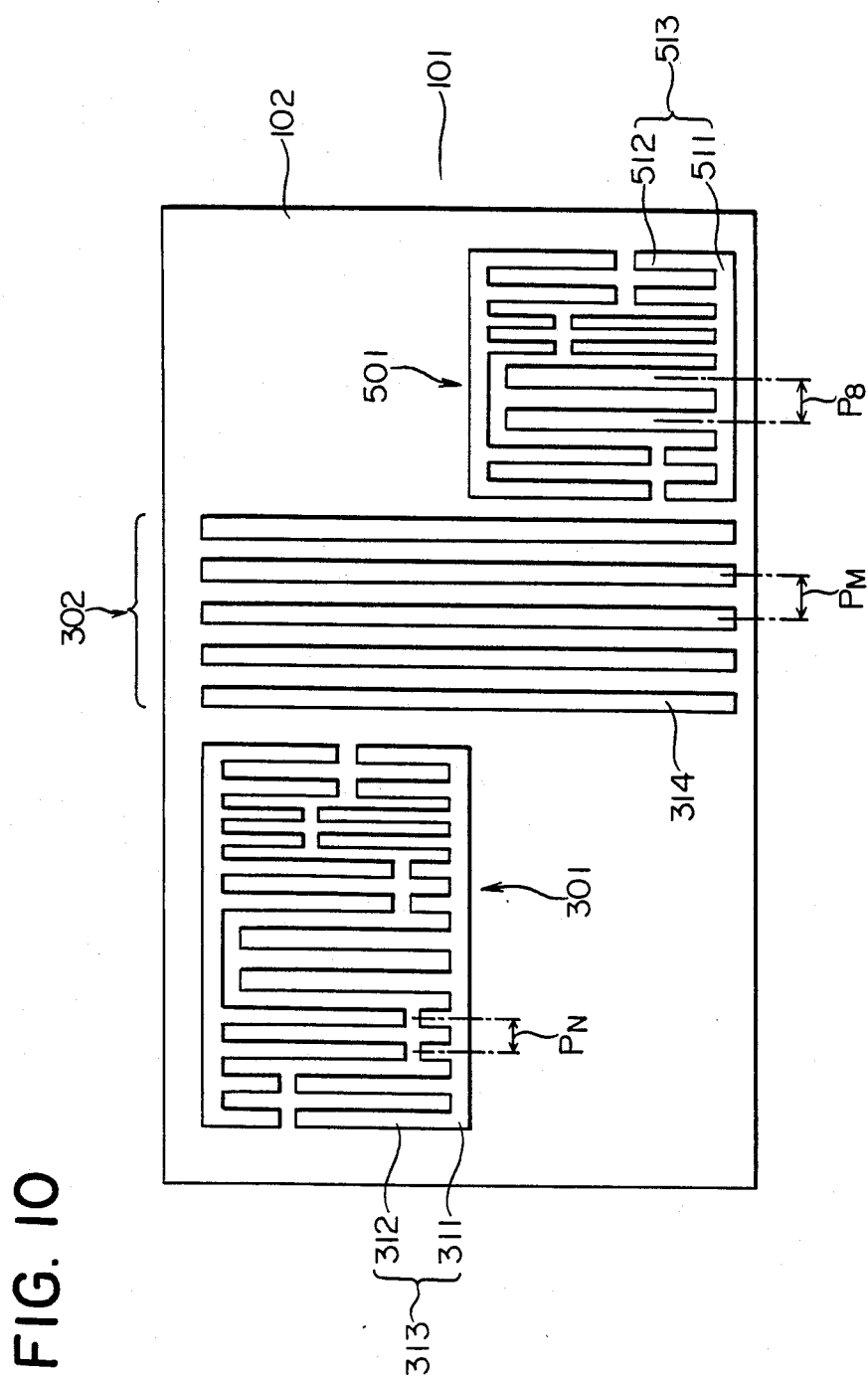
FIG. 10 is a type plan for explaining another embodiment of the SAW filter according to the present invention.
Figure 13:
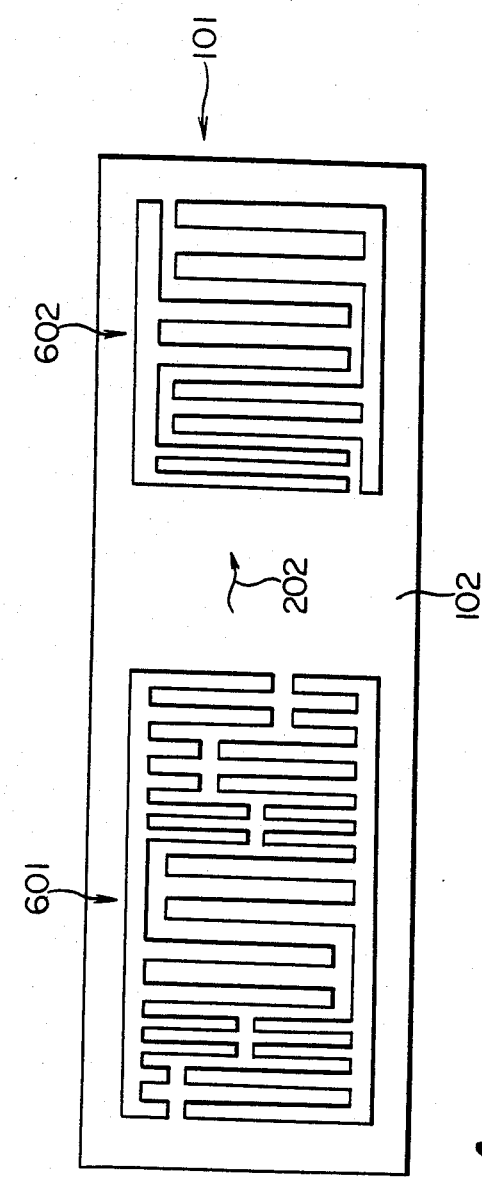
FIG. 13 is a type plan for explaining another embodiment of the SAW filter according to the present invention.

The SAW filter shown in FIG. 10 has a structure modified from the second transducer shown in FIG. 6. In the embodiment of FIG. 10, a frequency amplitude chgaracteristic of the SAW filter 101 has a center frequency $f_0$ of a passband and a frequency passband width $\Delta f_0$.

In FIG. 10, the second transducer 501 comprises an electrode of aluminum in which one end of a plurality of electrode fingers 512 crossing each other is electrically coupled by a bus bar 511 to construct a comb-shaped electrode 513. The crossing structure of the electrode fingers 512 is so called "weighted" so that the second transducer 501 is formed as an Apodized electrode.

This second transducer 501 is an Apodized electrode which has a frequency passband width of $\Delta f_1$, a center frequency passband $f_1$ of the frequency passband width $\Delta f_1$, and an electrode pitch $P_8$ of the adjacent electrode fingers 512 of the about $\frac{1}{4}$ wavelength $\lambda$ of the surface acoustic wave corresponding to the frequency $f_1$.

The relationship of a center frequency $f_0$ and a frequency passband width of $\Delta f_0$ of the first transducer 301, and the center frequency $f_1$ and the frequency poassband width $\Delta f_1$ of the second transducer 501 will now be described.

First, a case in which the frequencies $f_0$ and $f_1$ have the relation of $f_1 < f_0$ will be explained.

FIG. 11(a) shows a frequency characteristic of the first transducer 301 and FIG. 11(b) shows a frequency characteristic of the second transducer 501.

In the case of the SAW filter shown in FIG. 10, in order to prevent the production of third harmonics, a frequency passband in the vicinity of the frequency $3f_0$ of the first transducer 301 should not overlap with a frequency passband in the vicinity of the frequency $3f_1$ of the second transducer 501 in the same way as FIG. 6 (defined in "condition ($A_2$)").

As to FIG. 11(a) for the first transducer 301, a passband in the vicinity of the frequency $3f_0$ has a center frequency $3f_0$ and a frequency passband width $\Delta f_0$ so that a frequency passband commences with:

$$3f_0 - \Delta f_0/2 \tag{51}$$

As to FIG. 11(b) for the second transducer 501, a passband in the vicinity of the frequency $3f_1$ has a center frequency $3f_1$ and a frequency passband width $\Delta f_1$ so that a frequency passband ends with:

$$3f_1 + \Delta f_1/2 \tag{52}$$

Now, in order to satisfy the condition ($A_2$), the formula (52) should be less than or equal to the formula (51) so that the formula is:

$$3f_1 + \Delta f_1/2 \leq 3f_0 - \Delta f_0/2$$

Then:

$$f_1 \leq f_0 - \Delta f_0/6 - \Delta f_1/6 \tag{53}$$

is obtained.

Next, a case in which the frequencies $f_0$ and $f_1$ have the relation of $f_1 > f_0$ will be explained with reference to FIG. 12.

As to FIG. 12(a) for the first transducer 301, a passband in the vicinity of the frequency $3f_0$ has a center frequency $3f_0$ and the frequency passband width $\Delta f_0$ so that a frequency passband ends with:

$$3f_0 + \Delta f_0/2 \tag{54}$$

As to FIG. 12(b) for the second transducer 501, a passband in the vicinity of the frequency $3f_1$ has a center frequency $3f_1$ and a frequency passband width $\Delta f_1$ so that a frequency passband commences with:

$$3f_1 - \Delta f_1/2 \tag{55}$$

Now, in order to satisfy the condition ($A_2$), the formula (54) should be less than or equal to the formula (55) so that the formula is:

$$3f_0 + \Delta f_0/2 \leq 3f_1 - 3f_1/2$$

Then:

$$f_1 \geq f_0 + \Delta f_0/6 + \Delta f_1/6 \tag{56}$$

is obtained.

In other words, when the first and second transducers are formed so as to satisfy the formulas (53) and (56), respectively, extremely good characteristics as shown FIG. 11(c) and FIG. 12(c) can be obtained without producing third harmonics in the frequency characteristics of the SAW filter 101 shown in FIG. 10.

Although the multi-strip coupler is used in the above mentioned embodiment, the invention is not restricted to the embodiment and can also be a SAW filter without the multi-strip coupler.

When the multi-strip coupler is not used, the first transducer 601 comprises the weighted type electrode and the second transducer 602 comprises the unweighted electrode. The same may apply to a case in which the first and second transducers are formed so as to satisfy the formulas (53) and (56), respectively.

Although the first transducer of the embodiment shown in FIGS. 4 to 9 comprises a double electrode, the first transducer may comprise a solid electrode.

Figure 14:
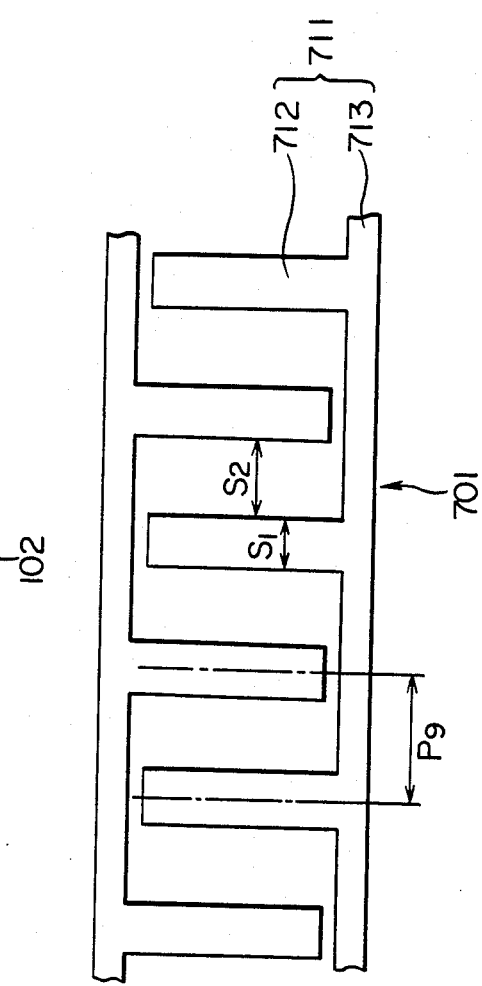
FIG. 14 is a patially enlarged plan view of the electrode for explaining another embodiment of the SAW filter according to the present invention.
Figure 15A:
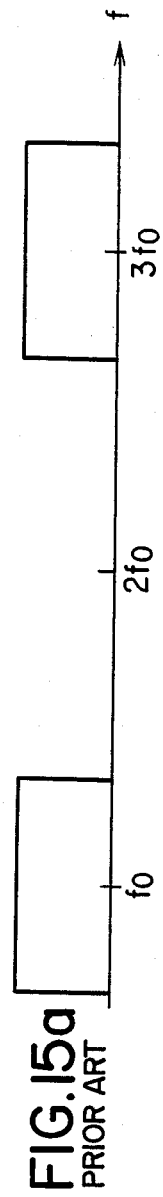
FIG. 15(a) through FIG. 15(c) are frequency characteristic diagrams for explaining a conventional SAW filter.
Figure 15B:
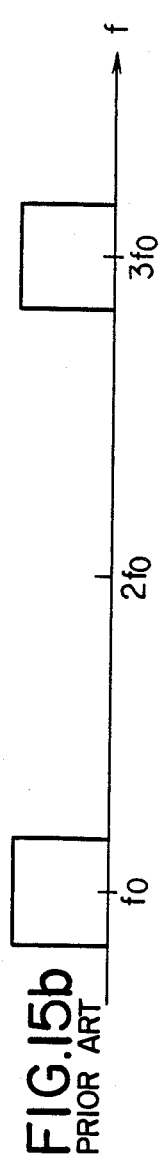
Figure 15C:
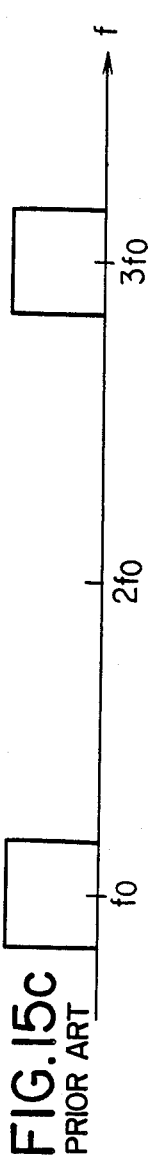

FIG. 14 shows a structure of a solid electrode in which a formal shaped electrode 701 comprises a pair of comb-shaped electrodes 711 crossing each other. This comb-shaped electrode 711 is formed so that one end of a plurality of electrode fingers 712 is electrically coupled by a bus bar 713.

The width $s_1$ of the electrode fingers 712 may not always be the same size as the space (gap) $s_2$ between the electrode fingers 712. Furthermore, the unweighted electrode 701 has an electrode pitch $P_9$ with a space of $\frac{1}{2}$ wavelength $\lambda$ of the SAW filter corresponding to the center frequency $f_0$.

What is claimed is:

1. A surface acoustic wave filter having a frequency passband width $\Delta f_0$ in a vicinity of a center frequency $f_0$, the filter comprising:
    a piezoelectric substrate;
    a first transducer including a pair of mutually opposed comb-shaped electrodes formed in a surface of the substrate, each of the first transducer electrodes having a plurality of substantially parallel electrode fingers, the first transducer having a frequency passband width of $\Delta f_1$ in a vicinity of a frequency $f_1$, the spacing between adjacent ones of the electrode fingers of the first transducer electrodes corresponding to the frequency $f_1$;
    a second transducer including a pair of mutually opposed comb-shaped electrodes formed in the surface of the substrate, each of the second transducer electrodes having a plurality of substantially parallel electrode fingers, the second transducer having a frequency passband width of $\Delta f_2$ in a vicinity of a frequency $f_2$, the spacing between adjacent ones of the electrode fingers of the second transducer electrodes corresponding to the frequency $f_2$ the frequencies $f_1$ and $f_2$ and the frequency passband widths $\Delta f_1$ and $\Delta f_2$ of the first and the second transducers being related by the expression $$|f_1 - f_2| \geq \tfrac{1}{6}(\Delta f_1 + \Delta f_2)$$

and $f_0$, $f_1$ and $f_2$ being nonequal and nonzero.

2. The surface acoustic wave filter of claim 1, wherein:
    the spacing between adjacent ones of the electrode fingers of the first transducer is substantially equal to $\frac{1}{4}$ wavelength of a surface acoustic wave corresponding to the frequency $f_1$; and
    the spacing between adjacent ones of the electrode fingers of the second transducer is substantially equal to $\frac{1}{4}$ wavelength of a surface acoustic wave corresponding to the frequency $f_2$.

3. The surface acoustic wave filter of claim 1, wherein at least one of the frequency $f_1$ of the first transducer and the frequency $f_2$ of the second transducer approximately corresponds to the frequency $f_0$ of the filter.

4. The surface acoustic wave filter of claim 3, wherein the spacing between adjacent ones of the electrode fingers of the transducer approximately corresponding to the frequency $f_0$ is substantially equal to $\frac{1}{4}$ wavelength of a surface acoustic wave corresponding to the frequency $f_0$.

5. The surface acoustic wave filter of claim 3, wherein the spacing between adjacent ones of the electrode fingers of the transducer approximately corresponding to the frequency $f_0$ is substantially equal to $\frac{1}{2}$ wavelength of a surface acoustic wave corresponding to the frequency $f_0$.

6. The surface acoustic wave filter of claim 1, wherein the electrode fingers of at least one of the first and the second transducers have nonuniform length.

7. The surface acoustic wave filter of claim 1, wherein:
each of the first transducer electrodes includes a bus bar coupled to the electrode fingers of that electrode, each of the bus bars being substantially parallel to and spaced from the bus bar of the other first transducer electrode; and
the electrode fingers of the first transducer have nonuniform length, each of the electrode fingers being substantially perpendicular to and positioned between the bus bars and being substantially colinear with a corresponding one of the electrode fingers of the other first transducer electrode.

8. The surface acoustic wave filter of claim 7, wherein the sum of the lengths of a finger electrode of one of the first transducer electrodes and the corresponding one of the finger electrodes of the other first transducer electrode is substantially equal to a constant for all of the electrode fingers of the one of the first transducer electrodes.

9. The surface acoustic wave filter of claim 1, wherein:
each of the second transducer electrodes includes a bus bar coupled to the electrode fingers of that electrode, each of the bus bars being substantially parallel to and spaced from the bus bar of the other second transducer electrode; and
the electrode fingers of the second transducer have nonuniform length, each of the electrode fingers being substantially perpendicular to and positioned between the bus bars and being substantially colinear with a corresponding one of the electrode fingers of the other second transducer electrode.

10. The surface acoustic wave filter of claim 9, wherein the sum of the lengths of each of a finger electrode of one of the second transducer electrodes and the corresponding one of the finger electrodes of the other second transducer electrode is substantially equal to a constant for all of the electrode fingers of the one of the second transducer electrodes.

11. A surface acoustic wave filter having a frequency passband width $\Delta f_0$ in a vicinity of a center frequency $f_0$, the filter comprising:
a piezoelectric substrate;
a first transducer including a pair of mutually opposed comb-shaped electrodes formed in a surface of the substrate, each of the first transducer electrodes having a plurality of substantially parallel electrode fingers, the first transducer having the frequency passband width of $\Delta f_0$;
a second transducer including a pair of mutually opposed comb-shaped electrodes formed in the surface of the substrate, each of the second transducer electrodes having a plurality of substantially parallel electrode fingers, the second transducer having a frequency passband width of $\Delta f_1$ in the vicinity of a center frequency $f_1$; the spacing between adjacent ones of the electrode fingers of the second transducer corresponding to a frequency $f_x$ and the center frequency $f_0$, the center frequency $f_1$, and the frequency $f_x$ satisfying at least one of the expressions $$4f_x - f_1 \geq 3f_0 + \Delta f_0/2 + \Delta f_1/2$$

and $$4f_x - f_1 \leq 3f_0 - \Delta f_0/2 - \Delta f_1/2$$

$f_0$ and $f_1$ being nonequal and nonzero.

12. The surface acoustic wave filter of claim 11, wherein the spacing between adjacent ones of the electrode fingers of the second transducer is substantially equal to $\frac{1}{4}$ wavelength of a surface acoustic wave corresponding to the frequency $f_x$.

13. The surface acoustic wave filter of claim 12, wherein the frequency $f_x$ approximately corresponds to the frequency $f_1$ and the second transducer comprises an unweighted electrode with a constant cross width.

14. The surface acoustic wave filter of claim 11, wherein the spacing between adjacent ones of the electrode fingers of the second transducer is substantially equal to $\frac{1}{2}$ wavelength of a surface acoustic wave corresponding to the frequency $f_1$.

15. The surface acoustic wave filter of claim 13 or 9, wherein the spacing between adjacent ones of the electrode fingers of the first transducer is substantially equal to $\frac{1}{4}$ wavelength of a surface acoustic wave corresponding to the frequency $f_0$.

16. The surface acoustic wave filter of claim 11, wherein the electrode fingers of at least one of the first and the second transducers have nonuniform length.

17. The surface acoustic wave filter of claim 11, wherein:
each of the first transducer electrodes includes a bus bar coupled to the electrode fingers of that electrode, each of the bus bars being substantially parallel to and spaced from the bus bar of the other first transducer electrode; and
the electrode fingers of the first transducer have nonuniform length, each of the electrode fingers being substantially perpendicular to and positioned between the bus bars and being substantially colinear with a corresponding one of the electrode fingers of the other first transducer electrode.

18. The surface acoustic wave filter of claim 17, wherein the sum of the lengths of a finger electrode of one of the first transducer electrodes and the corresponding one of the finger electrodes of the other first transducer electrode is substantially equal to a constant for all of the electrode fingers of the one of the first transducer electrodes.

19. The surface acoustic wave filter of claim 11, wherein:
each of the second transducer electrodes includes a bus bar coupled to the electrode fingers of that electrode, each of the bus bars being substantially parallel to and spaced from the bus bar of the other second transducer electrode; and the electrode fingers of the second transducer have nonuniform length, each of the electrode fingers being substantially perpendicular to and positioned between the bus bars and being substantially colinear with a corresponding one of the electrode fingers of the other second transducer electrode.

20. The surface acoustic wave filter of claim 19, wherein the sum of the lengths of a finger electrode of one of the second transducer electrodes and the corresponding one of the finger electrodes of the other second transducer electrode is substantially equal to a constant for all of the electrode fingers of the one of the second transducer electrodes.

21. A surface acoustic wave filter having a frequency passband width $\Delta f_0$ in a vicinity of a center frequency $f_0$, the filter, comprising:

a piezoelectric substrate;

a first transducer including a pair of mutually opposed comb-shaped electrodes formed in a surface of the substrate, each of the first transducer electrodes having a plurality of substantially parallel electrode fingers, the first transducer having the frequency passband width of $\Delta f_0$;

a second transducer including a pair of mutually opposed comb-shaped electrodes formed in the surface of the substrate, each of the second transducer electrodes having a plurality of substantially parallel electrode fingers, the second transducer having a frequency passband width of $\Delta f_1$ in a vicinity of a center frequency $f_1$, at least one of the expressions $$f_1 \leq f_0 - \Delta f_0/6 - \Delta f_1/6$$

and $$f_1 \geq f_0 + \Delta f_0/6 + \Delta f_1/6$$

being satisfied and $f_0$ and $f_1$ being nonequal and nonzero.

22. The surface acoustic wave filter of claim 21, wherein the electrode fingers of at least one of the first and the second transducers have nonuniform length.

23. The surface acoustic wave filter of claim 21, wherein:

each of the first transducer electrodes includes a bus bar coupled to the electrode fingers of that electrode, each of the bus bars being substantially parallel to and spaced from the bus bar of the other first transducer electrode; and the electrode fingers of the first transducer have nonuniform length, each of the electrode fingers being substantially perpendicular to and positioned between the bus bars and being substantially colinear with a corresponding one of the electrode fingers of the other first transducer electrode.

24. The surface acoustic wave filter of claim 23, wherein the sum of the lengths of a finger electrode of one of the first transducer electrodes and the corresponding one of the finger electrodes of the other first transducer electrode are substantially equal to a constant for all of the electrode fingers of the one of the first transducer electrodes.

25. The surface acoustic wave filter of claim 21, wherein:

each of the second transducer electrodes includes a bus bar coupled to the electrode fingers of that electrode, each of the bus bars being substantially parallel to and spaced from the bus bar of the other second transducer electrode; and the electrode fingers of the second transducer have nonuniform length, each of the electrode fingers being substantially perpendicular to and positioned between the bus bars and being substantially colinear with a corresponding one of the electrode fingers of the other second transducer electrode.

26. The surface acoustic wave filter of claim 25, wherein the sum of the lengths of a finger electrode of one of the second transducer electrodes and the corresponding one of the finger electrodes of the other second transducer electrode is substantially constant for all of the finger electrodes of the one of the second transducer electrodes.

* * * * *